(12) United States Patent
Ooishi

(10) Patent No.: US 8,891,035 B2
(45) Date of Patent: Nov. 18, 2014

(54) DISPLAY DEVICE AND FPC BOARD FIXING METHOD THEREOF

(75) Inventor: Mitsuma Ooishi, Kanagawa (JP)

(73) Assignee: NLT Technologies, Ltd., Kanagawa (JP)

( * ) Notice: Subject to any disclaimer, the term of this patent is extended or adjusted under 35 U.S.C. 154(b) by 330 days.

(21) Appl. No.: 13/018,738

(22) Filed: Feb. 1, 2011

(65) Prior Publication Data

US 2011/0187965 A1      Aug. 4, 2011

(30) Foreign Application Priority Data

Feb. 2, 2010    (JP) .................................. 2010-021081

(51) Int. Cl.
  *G02F 1/1333*  (2006.01)
  *G09F 13/04*   (2006.01)
  *H05K 13/00*   (2006.01)
  *H05K 1/00*    (2006.01)

(52) U.S. Cl.
  CPC ............... *G09F 13/04* (2013.01); *H05K 13/00* (2013.01); *H05K 1/00* (2013.01)
  USPC ............................................. 349/58; 349/150

(58) Field of Classification Search
  None
  See application file for complete search history.

(56) References Cited

U.S. PATENT DOCUMENTS

| | | | | |
|---|---|---|---|---|
| 6,677,664 B2 * | 1/2004 | Inoue et al. | ................... | 257/668 |
| 7,224,425 B2 * | 5/2007 | Yu | ................... | 349/187 |
| 7,263,269 B2 * | 8/2007 | Miyashita | ................... | 385/147 |
| 7,414,680 B2 * | 8/2008 | Lee et al. | ................... | 349/58 |
| 7,535,173 B2 | 5/2009 | Kim | | |
| 7,748,862 B2 * | 7/2010 | Kim | ................... | 362/97.2 |
| 2005/0111175 A1 | 5/2005 | Kim | | |
| 2007/0035689 A1 * | 2/2007 | Ryu | ................... | 349/149 |
| 2008/0080356 A1 | 4/2008 | Sekine et al. | | |

FOREIGN PATENT DOCUMENTS

| | | |
|---|---|---|
| CN | 1881035 A | 12/2006 |
| JP | 3-81727 | 4/1991 |
| JP | 7-038268 | 2/1995 |
| JP | 10-009224 | 1/1998 |
| JP | 10-135596 | 5/1998 |
| JP | 2002-204068 | 7/2002 |
| JP | 2002-372922 | 12/2002 |
| JP | 2003-262883 | 9/2003 |
| JP | 2005-122174 | 5/2005 |

(Continued)

OTHER PUBLICATIONS

Japanese Official Action—2010-021081—Jul. 9, 2013.

(Continued)

*Primary Examiner* — Richard Kim
(74) *Attorney, Agent, or Firm* — Young & Thompson

(57) ABSTRACT

Provided is a display device capable of preventing, in a case where a flexible printed circuit board is bent to be fixed to a support portion of the display device, a troublesome phenomenon due to a force generated in the flexible printed circuit board by recovery from deformation, that is, spring-back. The display device includes the flexible printed circuit board, and the flexible printed circuit board is disposed in a bent state, and has at least a hole formed therein. The flexible printed circuit board is fixed to a support member (for example, backlight back surface plate, frame, etc.) included in the display device by a first fixation member (for example, double-sided pressure sensitive adhesive tape) and further is fixed to the support member by a second fixation member (for example, pin) through the hole.

4 Claims, 8 Drawing Sheets

(56) References Cited

FOREIGN PATENT DOCUMENTS

| | | |
|---|---|---|
| JP | 2008-203445 | 9/2006 |
| JP | 2007-115748 | 5/2007 |
| JP | 2007-323017 | 12/2007 |
| JP | 2008-076930 | 4/2008 |
| JP | 2008-084452 | 4/2008 |
| JP | 2008-209838 | 9/2008 |

OTHER PUBLICATIONS

Chinese Office Action with Search Report for Application No. 201110033222.X issued Dec. 4, 2013.

* cited by examiner

DISPLAY DEVICE AND FPC BOARD FIXING METHOD THEREOF

This application is based upon and claims the benefit of priority from Japanese patent application No. 2010-021081, filed on Feb. 2, 2010, the disclosure of which is incorporated herein in its entirety by reference.

BACKGROUND OF THE INVENTION

1. Field of the Invention

This invention relates to a display device including a flexible printed circuit board and a method of fixing the flexible printed circuit board of the display device.

2. Description of the Related Art

In recent years, in small-sized liquid crystal display devices, there has been employed a chip on glass (COG) method in which a driver IC for driving liquid crystal is mounted on a liquid crystal panel. Here, the liquid crystal panel is connected with a flexible printed circuit board (hereinafter, referred to as FPC board) by pressure bonding through an anisotropic conductive film, and further, a backlight unit using light emitting diodes (LED) is used in most cases.

As technologies related to such a liquid crystal display device including the FPC board, patent documents described below may be exemplified. Hereinafter, devices according to the respective patent documents are briefly described. Members having the same function and portions having similar names in the respective patent documents are denoted by the same reference symbols. However, different reference symbols might be used if there are components to be specially mentioned.

In a liquid crystal display device disclosed in Japanese Unexamined Patent Application Publication (JP-A) No. 2008-203445, as illustrated in FIGS. 6A and 6B, a bent FPC board 101 is included, and through holes 102 are formed in a bending portion of the FPC board 101. Note that, FIG. 6A is a cross-sectional view of the liquid crystal display device, and FIG. 6B is a developed plane view of the FPC board 101.

When the FPC board 101 is bent, internal stress is generated in a bending region, and brings about a repulsive force or a recovery force due to the bending. This force of the FPC board 101 acts on lifting up a part of a liquid crystal panel 103, which is provided in pressure bonding to the FPC board 101.

Therefore, in order to prevent the lifting of the part of the liquid crystal panel 103, Japanese Unexamined Patent Application Publication (JP-A) No. 2008-203445 proposes a method of decreasing the internal stress by forming the through holes 102 in the FPC board and, as a result, by reducing a sectional area of the FPC board 101, as illustrated in FIG. 6A. This method makes it possible to prevent the lifting phenomenon of the part of the liquid crystal panel 103, which is caused by the repulsive force or the recovery force of the FPC board 101.

Specifically, the liquid crystal display device illustrated in FIG. 6A includes the liquid crystal panel 103, a backlight unit 104, a double-sided pressure sensitive adhesive tape 105, a driver IC 106, a circuit substrate 107, and the FPC board 101.

The liquid crystal panel 103 includes a thin film transistor (TFT) glass substrate 108, a color filter glass substrate 109, and liquid crystal (not shown) provided between the substrates. Polarizing plates 110 and 111 are disposed on an upper side and a lower side of the liquid crystal panel 103, respectively.

The backlight unit 104 includes a frame 112, an LED 113, a light guide plate 114, a reflection film 115, and optical films 116 and 117.

The double-sided pressure sensitive adhesive tape 105 is a rectangular shape, and is provided between the liquid crystal panel 103 and the backlight unit 104 to fix the liquid crystal panel 103 and the backlight unit 104. The backlight unit 104 is adhered and fixed onto the circuit substrate 107 by a double-sided pressure sensitive adhesive tape 118. One end of the FPC board 101 is pressure bonded to the liquid crystal panel 103, and another end of the FPC board 101 is pressure bonded to the circuit substrate 107.

The FPC board 101 is bent in the example above, and hence internal stress is generated. Therefore, an FPC pressure-bonding portion of the liquid crystal panel 103 receives a force applied in the upper direction in the plane of the sheet of FIG. 6A. When this force is strong, it often happens that the liquid crystal panel 103 is separated from the double-sided pressure sensitive adhesive tape 105 to be lifted up.

Therefore, in Japanese Unexamined Patent Application Publication (JP-A) No. 2008-203445, the through holes 102 are formed in the FPC board 101, to thereby reduce the sectional area of the region in which the internal stress is generated. In this manner, the internal stress is reduced. As a result, the lifting of the liquid crystal panel 103 may be prevented.

In addition, Japanese Unexamined Patent Application Publication (JP-A) No. 2007-323017 discloses a liquid crystal display device, as illustrated in FIG. 7. In the illustrated liquid crystal device, a prominence 131 is formed on a holder 130, and the prominence 131 is inserted through a through hole 133 formed in an FPC board 132. Note that, FIG. 7 is a cross-sectional view of the liquid crystal display device.

In FIG. 7, the prominence 131 formed on a side surface of the holder 130 is helpful to suppress a warp of the FPC board 132 in the upper direction (upper side in the plane of the sheet of FIG. 7). Therefore, the FPC board 132 may be prevented from being separated from the liquid crystal panel or being detached from the holder 130.

Japanese Unexamined Patent Application Publication (JP-A) No. 07-38268 discloses a housing assemble structure of a flexible unit, which is similar in structure to that of Japanese Unexamined Patent Application Publication (JP-A) No. 2007-323017. In Japanese Unexamined Patent Application Publication (JP-A) No. 07-38268, a hole is formed in an FPC board, and the hole is engaged with a shaft formed in a housing, to thereby absorb an external force applied to the FPC board. In this manner, solder connection portions of the FPC board and a substrate are prevented from being separated from each other.

In addition, an FPC board 143 in Japanese Unexamined Patent Application Publication (JP-A) No. 10-135596 has, as illustrated in FIGS. 8A and 8B, a through hole 141 formed therein near an FPC connection terminal 140. A land (reinforcement land) 142 is formed in the through hole 141. Note that, FIG. 8A is a partial plane view of the FPC board 143 in a region near the FPC connection terminal 140, and FIG. 8B is a cross-sectional view of this part taken along the line passing through the through hole 141.

As is understood from FIGS. 8A and 8B, a connection terminal 145 of a circuit substrate 144 and the land 142 are soldered to each other with solder 146. In this manner, a soldering strength is reinforced to prevent separation of the FPC connection terminal 140.

Japanese Unexamined Patent Application Publication (JP-A) No. 2008-84452 discloses an optical pick-up using a technology similar to that of Japanese Unexamined Patent Application Publication (JP-A) No. 10-135596. That is, a PD flexible printed board and an optical pick-up (OPU) circuit substrate are fixed to each other at three points to prevent occurrence of separation.

Specifically, a central reinforcing land and both-end reinforcing lands are formed on the OPU circuit substrate, and a central circular hole and both-end connecting parts are correspondingly formed on the PD flexible printed board. The central reinforcing land and the central circular hole, and each both-end reinforcing land and the corresponding both-end connecting part are fixed to each other by soldering, to thereby improve connection strength.

In addition, in a display device disclosed in Japanese Unexamined Patent Application Publication (JP-A) No. 2008-76930, as illustrated in FIG. 9, an FPC board 151 is connected to a (liquid crystal display) substrate 150, and a through hole 152 formed in the substrate 150 and a through hole 153 formed in the FPC board 151 are aligned with each other. In this state, the substrate 150 and the FPC board 151 are fixed to each other by a joint member 154 passing through both of the through holes 152 and 153. With this structure, separation due to bending of the FPC board 151 may be prevented. Note that, the joint member 154 is formed by a thermoplastic material, a high polymer material, a metal material, a bolt, and a nut.

In addition, Japanese Unexamined Patent Application Publication (JP-A) No. 10-9224 discloses a method of fixing and reinforcing an FPC board 160 by using a pair of fixation clips as illustrated in FIG. 10. Through holes 162 are formed in a substrate 161, and through bores (holes) 163 are formed in the FPC board 160 at corresponding positions.

Under a state in which both of the through holes 162 and 163 are aligned, the substrate 161 and the FPC board 160 are soldered to each other. Then, a pin 165 of one clip 164 is inserted through one pair of the through holes 162 and 163 from an upper side of the FPC board 160, and a pin 167 of another clip 166 is inserted through another pair of the through holes 162 and 163 from a lower side of the substrate 161. In this state, the pins 165 and 167 are fitted into sockets 168 and 169 of the opposing clips 166 and 164, respectively. With this structure, separation between the FPC board 160 and the substrate 161 due to external stress may be prevented.

Japanese Unexamined Patent Application Publication (JP-A) No. 2002-204068 discloses a technology related to a method of jointing a printed wiring board and an FPC board, which is similar to that of Japanese Unexamined Patent Application Publication (JP-A) No. 10-9224. In Japanese Unexamined Patent Application Publication (JP-A) No. 2002-204068, as illustrated in FIG. 11, pin holes 172 and 173 are formed at joint portions of an FPC board 170 and a printed wiring board 171, respectively, and the printed wiring board 171 and the FPC board 170 are sandwiched between a pin plate 174 and a holed plate 175 in which a pin hole 177 is formed.

In this manner, a pin 176 of the pin plate 174 is caused to pass through the respective pin holes 172, 173, and 177 of the FPC board 170, the printed wiring board 171, and the holed plate 175, and after that, a tip end of the pin 176 is clamped. With this, separation in a case where stress is applied to the FPC board 170 is prevented.

In addition, in a plasma display module disclosed in Japanese Unexamined Patent Application Publication (JP-A) No. 2005-122174, as illustrated in FIG. 12, in order to bring a grounded line 180 and a chassis base 181 in intimate contact to each other, a wiring 182, specifically, a through bore (hole) 183 of an FPC board is formed. Further, a coupling hole 184 is formed in the chassis base 181, and a coupler as pressure means 185, for example, a screw is screwed therein.

However, when the FPC board is fixed to a support portion of the liquid crystal display device in a bent state, due to a force generated in the FPC board by recovery from deformation, that is, spring-back, troublesome phenomena described below occur in some cases.

Specifically, in a liquid crystal display device including a backlight unit, a liquid crystal panel, an FPC board for backlight, which is connected to the backlight unit, and an FPC board for liquid crystal panel, which is connected to the liquid crystal panel, in a case where the FPC board for liquid crystal panel is bent to be fixed to a back surface of the backlight unit being the support portion by a double-sided pressure sensitive adhesive tape, there occurs, in some cases, a troublesome phenomenon that the FPC board for liquid crystal panel is separated from the double-sided pressure sensitive adhesive tape adhered onto the back surface of the backlight unit.

Moreover, there occurs, in some cases, a troublesome phenomenon that the liquid crystal panel is lifted up from the backlight unit.

Further, when the FPC board for backlight is used in a bent state, there occurs, in some cases, a troublesome phenomenon that the LED fixed onto the FPC board for backlight is displaced, which causes uneven brightness.

Further, in Japanese Unexamined Patent Application Publication (JP-A) No. 2008-203445, the through holes 102 are formed in the FPC board 101 to reduce the sectional area thereof, and accordingly reduce the internal stress. However, as illustrated in FIG. 6B, a size or position of each of the through holes 102 capable of being formed in the FPC board 101 for reduction of the sectional area is limited because a conductive pattern 119 exists. Therefore, an effect of reducing the internal stress of the FPC board 101 is limited.

In Japanese Unexamined Patent Application Publication (JP-A) No. 2007-323017, when the holder 130 is stored in the frame, the FPC board 132 is also stored in the frame, and hence it is necessary to shape the frame structure so that an FPC terminal can be taken out to the outside.

Further, as illustrated in FIG. 7, the LED 113 is mounted on an upper side of the FPC board 132, and the reflection film 115 is not provided directly under the LED 113. In order to improve the brightness, it is preferred that the LED 113 be mounted on a lower side of an FPC board for LED, and the reflection film 115 be provided directly under the LED 113.

In this case, it is difficult to integrally form the FPC board for LED, that is, the FPC board for backlight, and the FPC board for liquid crystal panel as one FPC board. Further, when an FPC terminal for backlight and an FPC terminal for liquid crystal panel are taken out of the frame, terminal connectors are necessary for the FPC board for backlight and the FPC board for liquid crystal panel.

In Japanese Unexamined Patent Application Publication (JP-A) No. 10-135596, in a case where the circuit substrate 144 illustrated in FIG. 8B is replaced by the backlight unit, it is necessary to add a step of forming a land for solder on the backlight unit and a step of soldering the land with the through hole of the FPC board.

In Japanese Unexamined Patent Application Publication (JP-A) No. 2008-76930, in a case where the substrate 150 illustrated in FIG. 9 is replaced by the backlight unit, a backlight unit through hole and an FPC through hole are formed, and an I-shaped joint member passing through both of the through holes is used for fixation.

In this case, it is necessary to cause the I-shaped joint member to extend beyond the lower side of the backlight unit through hole. This extending portion of the I-shaped joint member is responsible for an increase in thickness of the liquid crystal display device.

In Japanese Unexamined Patent Application Publication (JP-A) No. 10-9224, in a case where the substrate 161 illustrated in FIG. 10 is replaced by the backlight unit, backlight unit through holes and FPC through holes are formed, and the pins of the pair of clips are inserted through the through holes in the substrate and the FPC through holes. Further, the pins are fitted into the sockets of the opposing clips, respectively. In this case, the clip on the lower side of the backlight unit is responsible for an increase in thickness of the liquid crystal display device.

Similarly, in Japanese Unexamined Patent Application Publication (JP-A) No. 2002-204068, in a case where the printed wiring board 171 illustrated in FIG. 11 is replaced by the backlight unit, pin holes are formed at joint portions of the backlight unit and the FPC board, and the pin of the pin plate is caused to pass through the respective pin holes of the backlight unit, the FPC board, and the holed plate, and after that, the tip end of the pin is clamped. In this case, the pin plate or the holed plate is inevitably increased in thickness of the liquid crystal display device.

In Japanese Unexamined Patent Application Publication (JP-A) No. 2005-122174, in a case where the chassis base 181 illustrated in FIG. 12 is replaced by the backlight unit, a hole is formed in the FPC board to screw the FPC board to the backlight unit with a screw. In this manner, rigid fixation may be achieved. However, in this case, a device such as an electric screwdriver is necessary, and also it is necessary to add a step of fixing the screw by rotating the screw.

SUMMARY

A first object of an exemplary embodiment of this invention is to provide a display device, in which an FPC board is fixed to a support portion by first fixing member or fixation member and the FPC board is prevented from being separated from the first fixing member by a second fixing member.

In addition, a second object of an exemplary embodiment of this invention is to provide a display device, in which an FPC board is fixed to a support portion by a double-sided pressure sensitive adhesive tape, to thereby prevent, in particular, the FPC board from being separated from the double-sided pressure sensitive adhesive tape.

In order to solve the above-mentioned problems, a display device according to an exemplary embodiment of this invention includes: a flexible printed circuit board; and a support member, in which: the flexible printed circuit board is disposed in a bent state, and has at least one of a hole and a slit formed therein; and the flexible printed circuit board is fixed to the support member by a first fixing member and is fixed to one of the support member and the first fixing member by a second fixing member through, at least, the one of the hole and the slit.

Further, a display device according to an alternative exemplary embodiment of this invention includes: a backlight unit; a liquid crystal panel; and a flexible printed circuit board connected to one of the backlight unit and the liquid crystal panel, in which: the flexible printed circuit board has one of a hole and a slit formed therein on at least one of a back surface portion and a front surface portion of the backlight unit; under a state in which the flexible printed circuit board is bent, the flexible printed circuit board is adhered to at least one of the back surface portion and the front surface portion of the backlight unit by a double-sided pressure sensitive adhesive tape; and by a pressure sensitive adhesive tape which is adhered over an upper portion of the one of the hole and the slit formed in the flexible printed circuit board, the double-sided pressure sensitive adhesive tape and the pressure sensitive adhesive tape are adhered to each other through the one of the hole and the slit.

Further, a method of fixing a flexible printed circuit board of a display device having a support member according to an alternative exemplary embodiment of this invention includes: preparing the flexible printed circuit board having at least one of a hole and a slit; putting the flexible printed circuit board in a bent state; fixing the flexible printed circuit board to the support member by a first fixing member; and fixing the flexible printed circuit board to one of the support member and the first fixing member by a second fixing member through, at least, the one of the hole and the slit.

According to another exemplary embodiment of this invention, the hole or the slit is formed in the FPC board, and wirings of the FPC board are connected to parts included in the display device. The FPC board is put in a bent state. In this state, the FPC board is fixed to the support portion by the first fixing member including the resin adhesive, the hot melt adhesive, and the pressure sensitive adhesive. Further, fixation of the FPC board in a portion in which the hole or the slit is formed is reinforced by the second fixing member including the resin adhesive, the hot melt adhesive, the pressure sensitive adhesive, and the pin inserted in the hole formed in the support portion. In this manner, rigid fixation of the FPC board may be achieved, and it is possible to prevent occurrence of a troublesome phenomenon due to a recovery force of the bent FPC board.

More specifically, the FPC board may be either an FPC board including a wiring for a liquid crystal panel (called a liquid crystal panel FPC board hereinafter) or an FPC board including a wiring for a backlight unit (called a backlight FPC board). The liquid crystal panel FPC board is mounted on a back surface or a front surface of the backlight unit while the backlight FPC board is mounted on a back surface of the backlight unit. In this event, at least one of the liquid crystal panel FPC board and the backlight FPC board is adhered to the support member by the double-sided pressure sensitive adhesive tape, and by the pressure sensitive adhesive tape adhered over the upper portion of the hole or the slit of the liquid crystal panel FPC board or the backlight FPC board formed at the back surface portion or the front surface portion of the backlight unit. In this manner, it is possible to prevent occurrence of a troublesome phenomenon that the bent liquid crystal panel FPC board is separated from the double-sided pressure sensitive adhesive tape adhered to the back surface or the front surface of the backlight unit due to the spring-back, or to prevent occurrence of a troublesome phenomenon that an LED is displaced due to the recovery force of the bent backlight FPC board.

BRIEF DESCRIPTION OF THE DRAWINGS

In the accompanying drawings:

FIGS. 1A to 1C are views of a display device according to a first exemplary embodiment of this invention, in which FIG. 1A is a cross-sectional view, FIG. 1B is a plane view seen from a front surface side, and FIG. 1C is a plane view seen from a back surface side;

FIGS. 2A to 2C are views of a display device according to a second exemplary embodiment of this invention, in which FIG. 2A is a cross-sectional view, FIG. 2B is a plane view seen from a front surface side, and FIG. 2C is a plane view seen from a back surface side;

FIGS. 3A to 3C are views of a display device according to a third exemplary embodiment of this invention, in which FIG. 3A is a cross-sectional view, FIG. 3B is a plane view seen from a front surface side, and FIG. 3C is a plane view seen from a back surface side;

FIGS. 4A to 4C are views of a display device according to a fourth exemplary embodiment of this invention, in which FIG. 4A is a cross-sectional view, FIG. 4B is a plane view seen from a front surface side, and FIG. 4C is a plane view seen from a back surface side;

FIGS. 5A to 5C are views of a display device according to a fifth exemplary embodiment of this invention, in which FIG. 5A is a cross-sectional view, FIG. 5B is a plane view seen from a front surface side, and FIG. 5C is a plane view seen from a back surface side;

FIGS. 6A and 6B are views of a liquid crystal display device according to a related art, in which FIG. 6A is a cross-sectional view, and FIG. 6B is a plane view of an FPC board of the liquid crystal display device;

FIGS. 8A and 8B are views of an FPC board according to a related art, in which FIG. 8A is plane view, and FIG. 8B is a cross-sectional view of FIG. 8A;

EXEMPLARY EMBODIMENTS

Hereinafter, in each embodiment, a liquid crystal display device is described as an example of a display device, but the display device is not limited to a liquid crystal display device.

<First Exemplary Embodiment>

Figure 1A:
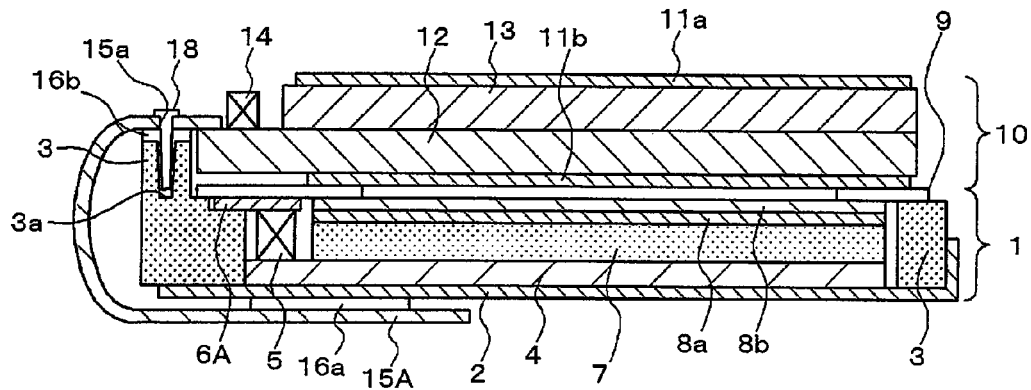
Figure 1B:
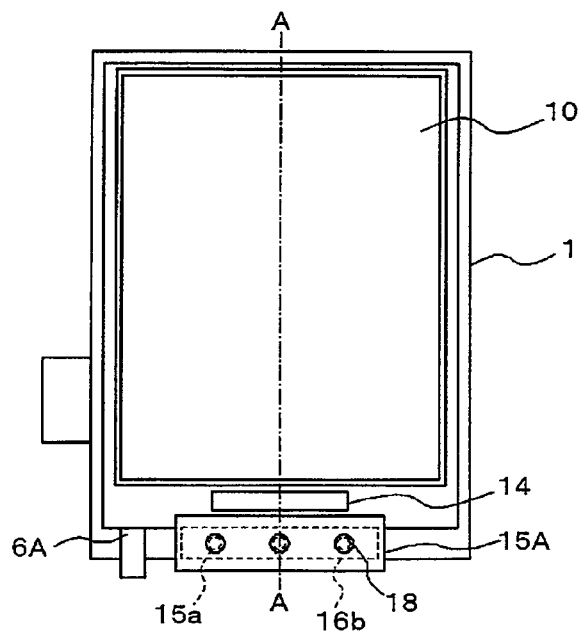
Figure 1C:
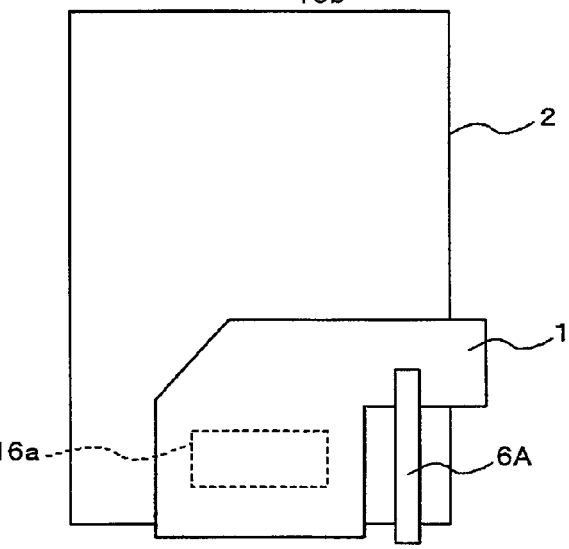

A first exemplary embodiment of this invention is described. FIG. 1A is a cross-sectional view of a liquid crystal display device according to the first exemplary embodiment. Further, FIG. 1B is a plane view seen from a front surface side (display surface side), and FIG. 1C is a plane view seen from a back surface side (rear surface side). Note that, FIG. 1A is a cross-sectional view taken along the line A-A of FIG. 1B.

A summary of the liquid crystal display device according to the first exemplary embodiment is as follows. It is to be noted that the illustrated liquid crystal display device comprises a liquid crystal panel FPC board 15A which has a wiring and electrodes for a liquid crystal panel and also has a hole or holes 15a formed therein. The liquid crystal panel FPC board 15A is adhered by double-sided pressure sensitive adhesive tapes 16a and 16b to a backlight back surface plate 2 and a frame 3, respectively, both of which act as a support portion. The double-sided pressure sensitive adhesive tapes 16a and 16b may be referred to as a first fixing member or a first fixation member. Further, pins 18 are inserted in the holes 15a formed through the liquid crystal panel FPC board 15A and in holes 3a formed in the frame 3 and may be referred to as a second fixing member or a second fixation member.

Hereinafter, details are described. The liquid crystal display device includes a backlight unit 1, a liquid crystal panel 10, a backlight FPC board 6A connected to the backlight unit 1, and the liquid crystal panel FPC board 15A connected to the liquid crystal panel 10. The liquid crystal panel 10 and the backlight unit 1 are adhered to each other by a double-sided pressure sensitive adhesive tape 9.

The liquid crystal panel 10 includes a thin film transistor (TFT) glass substrate 12, a color filter glass substrate 13, and liquid crystal (not shown) provided between the substrates. Polarizing plates 11a and 11b are disposed on an upper panel surface and a lower panel surface of the liquid crystal panel 10, respectively. Further, a driver IC 14 is mounted on the liquid crystal panel 10. The liquid crystal panel FPC board 15A and the liquid crystal panel 10 are brought into pressure bonding to each other through an anisotropic conductive film.

The backlight unit 1 includes the frame 3, a light emitting diode (LED) 5, a light guide plate 7, a reflection film 4, and optical films 8a and 8b.

The liquid crystal panel FPC board 15A has holes 15a placed at a portion thereof. The portion of the holes 15a is situated on a front surface of the backlight unit 1 when the liquid crystal panel FPC board 15A is put into a bent state, as illustrated in FIG. 1A.

In this state, the liquid crystal panel FPC board 15A is adhered to the front surface of the backlight unit 1 by the double-sided pressure sensitive adhesive tape 16b, and is also adhered to a back surface of the backlight unit 1 by the double-sided pressure sensitive adhesive tape 16a. Thus, the double-sided pressure sensitive adhesive tapes 16a and 16b serves as the first fixing member. In addition, each of the pins 18 as the second fixing member is inserted through the hole 15a of the liquid crystal panel FPC board 15A and in the hole 3a of the frame 3. From this fact, it is readily understood that the liquid crystal panel FPC board 15A is fixed to the backlight unit 1 by a double fixing structure.

The liquid crystal panel FPC board 15A and the frame 3 are rigidly fixed to each other by the pins 18 by the double fixing structure. Further, the double-sided pressure sensitive adhesive tape 16b is interposed between the pins 18 and the frame 3, and hence it is possible to easily prevent a trouble of the pins 18 coming out or getting loosened.

Further, as illustrated in FIG. 1C, the wiring of the backlight FPC board 6A and the wiring of the liquid crystal panel FPC board 15A are connected to each other by solder or a connector on the backlight back surface plate 2. In this manner, connection is enabled by one FPC terminal. In addition, the liquid crystal panel FPC board 15A is attached to a lower side of the backlight unit 1, as shown in FIG. 1A. This structure makes it possible to extend the reflection film 4 under the light emitting diode (LED) 5 serving as a light source and to effectively reflect light from the LED 5.

<Second Exemplary Embodiment>

Figure 2A:
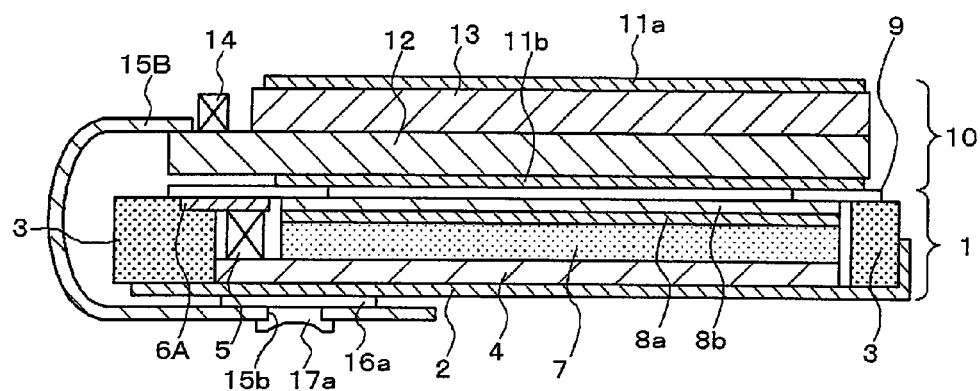
Figure 2B:
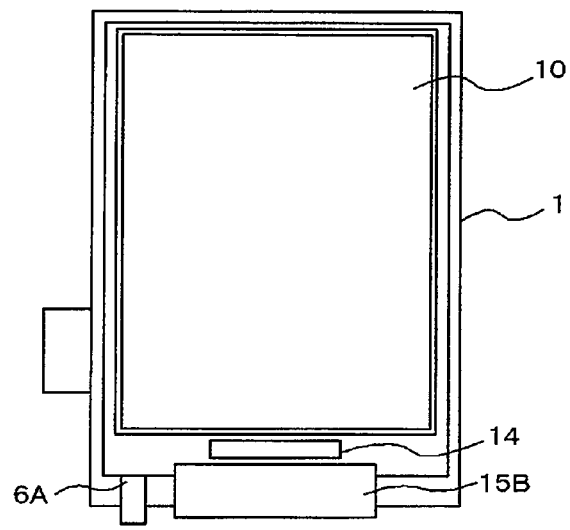
Figure 2C:
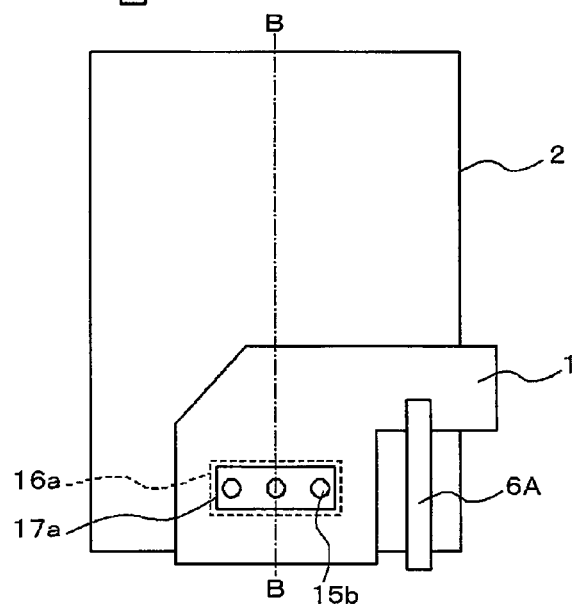

Next, a second exemplary embodiment of this invention is described. Hereinafter, similar components to those in the first exemplary embodiment are denoted by the same reference symbols, and description thereof is omitted as appropriate. FIG. 2A is a cross-sectional view of a liquid crystal display device according to the second exemplary embodiment of this invention. Further, FIG. 2B is a plane view seen from the front surface side, and FIG. 2C is a plane view seen from the back surface side. Note that, FIG. 2A is a cross-sectional view taken along the line B-B of FIG. 2C.

A summary of the liquid crystal display device according to the second exemplary embodiment is as follows. As seen in FIG. 2A, the illustrated liquid crystal display device comprises a liquid crystal panel FPC board 15B which has a wiring and electrodes for a liquid crystal panel and also has holes 15b formed therein. The liquid crystal panel FPC board 15B is adhered by the double-sided pressure sensitive adhesive tape 16a to the backlight back surface plate 2 which acts as a support portion. The double-sided pressure sensitive adhesive tape 16a may be referred to as a first fixing member or first fixation member.

Further, a pressure sensitive adhesive tape 17a is adhered over upper portions of the holes 15b of the liquid crystal panel FPC board 15B and may be referred to as a second fixing member or a second fixation member. The double-sided pressure sensitive adhesive tape 16a and the pressure sensitive adhesive tape 17a are adhered to each other through the holes 15b. In this manner, the liquid crystal panel FPC board 15B is fixed to the support portion by a double fixing structure.

Hereinafter, details are described. The illustrated liquid crystal display device includes the backlight unit 1, the liquid crystal panel 10, the backlight FPC board 6A connected to the backlight unit 1, and the liquid crystal panel FPC board 15B connected to the liquid crystal panel 10. The holes 15b are formed in a portion of the liquid crystal panel FPC board 15B, which is positioned at the back surface of the backlight unit 1.

The liquid crystal panel FPC board 15B is adhered to the back surface of the backlight unit 1 by the double-sided pressure sensitive adhesive tape 16a. Further, the pressure sensitive adhesive tape 17a is adhered over the upper portions of the holes 15b of the liquid crystal panel FPC board 15B. In this manner, the double-sided pressure sensitive adhesive tape 16a and the pressure sensitive adhesive tape 17a are adhered to each other through the holes 15b. With this, the adhesion between the double-sided pressure sensitive adhesive tape 16a and the pressure sensitive adhesive tape 17a is effective to prevent a trouble that the bent liquid crystal panel FPC board 15B is separated from the double-sided pressure sensitive adhesive tape 16a.

<Third Exemplary Embodiment>

Figure 3A:
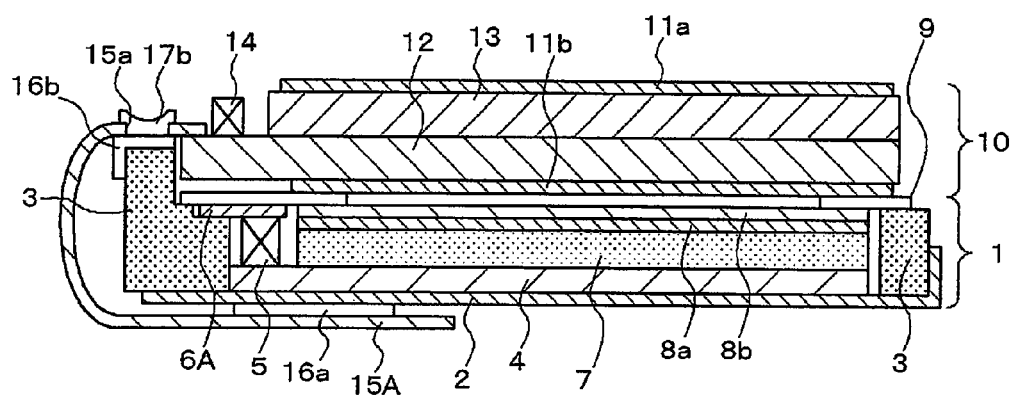
Figure 3B:
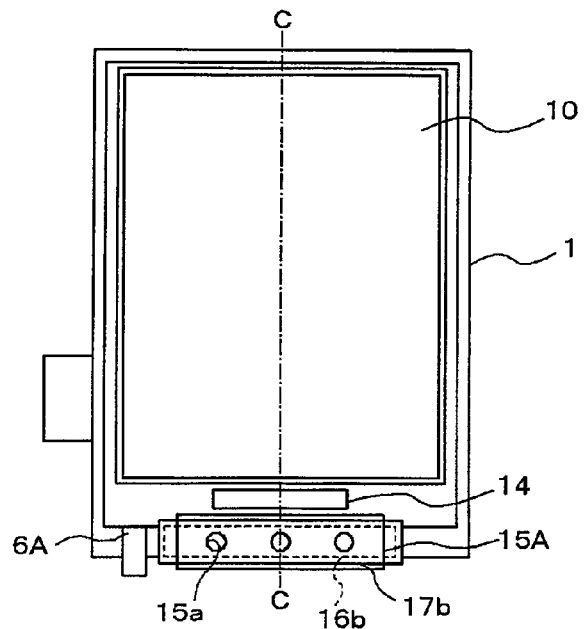
Figure 3C:
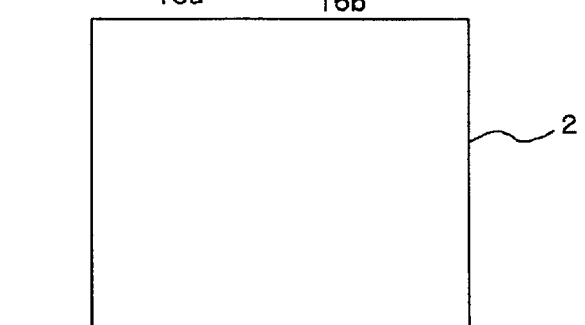
Figure 3C:
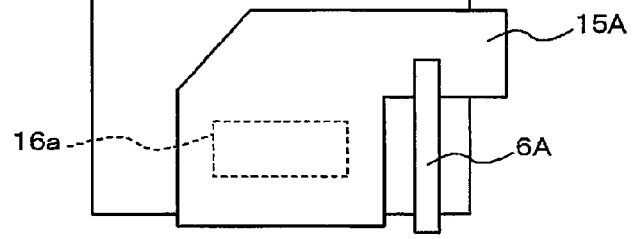

Next, a third exemplary embodiment of this invention is described. FIG. 3A is a cross-sectional view of a liquid crystal display device according to the third exemplary embodiment of this invention. Further, FIG. 3B is a plane view seen from the front surface side, and FIG. 3C is a plane view seen from the back surface side. Note that, FIG. 3A is a cross-sectional view taken along the line C-C of FIG. 3B.

A summary of the liquid crystal display device according to the third exemplary embodiment is as follows. As illustrated in FIG. 3A, the liquid crystal display device comprises a liquid crystal panel FPC board for 15A which has a wiring and electrodes for liquid crystal panel and also has the holes 15a formed therein. The liquid crystal panel FPC board 15A is adhered by the double-sided pressure sensitive adhesive tape 16b to the front surface of the frame 3 which acts as a support portion. The double-sided pressure sensitive adhesive tape 16b may be referred to as a first fixing member or first fixation member.

Further, a pressure sensitive adhesive tape 17b is adhered over upper portions of the holes 15a formed in the liquid crystal panel FPC board 15A and may be referred to as a second fixing member or a second fixation member. Through the holes 15a formed in the liquid crystal panel FPC board 15A, the double-sided pressure sensitive adhesive tape 16b and the pressure sensitive adhesive tape 17b are adhered to each other. In this manner, the liquid crystal panel FPC board 15A is fixed to the support portion by a double fixing structure.

Hereinafter, details are described. The liquid crystal display device includes the backlight unit 1, the liquid crystal panel 10, the backlight FPC board 6A connected to the backlight unit 1, and the liquid crystal panel FPC board 15A connected to the liquid crystal panel 10.

The holes 15a are formed in a portion of the FPC board for liquid crystal panel 15A which is situated at a front surface portion of the backlight unit 1. The liquid crystal panel FPC board 15A is adhered to the front surface side of the backlight unit 1 by the double-sided pressure sensitive adhesive tape 16b, and is adhered to the back surface side of the backlight unit 1 by the double-sided pressure sensitive adhesive tape 16a.

Further, the pressure sensitive adhesive tape 17b is adhered over the upper portions of the holes 15a of the FPC board for liquid crystal panel 15A, and thus the double-sided pressure sensitive adhesive tape 16b and the pressure sensitive adhesive tape 17b are adhered to each other through the holes 15a.

In this manner, the adhesion between the double-sided pressure sensitive adhesive tape 16b and the pressure sensitive adhesive tape 17b serves to prevent a trouble that the bent liquid crystal panel FPC board 15A is separated from the double-sided pressure sensitive adhesive tape 16b.

Further, as illustrated in FIG. 3A, the double-sided pressure sensitive adhesive tape 16b is also provided and extended on a side surface of the frame 3, and hence an adhesion area between the double-sided pressure sensitive adhesive tape 16b and the frame 3 is widened. Thus, it is also possible to prevent a trouble that the double-sided pressure sensitive adhesive tape 16b is separated from the frame 3.

<Fourth Exemplary Embodiment>

Figure 4A:
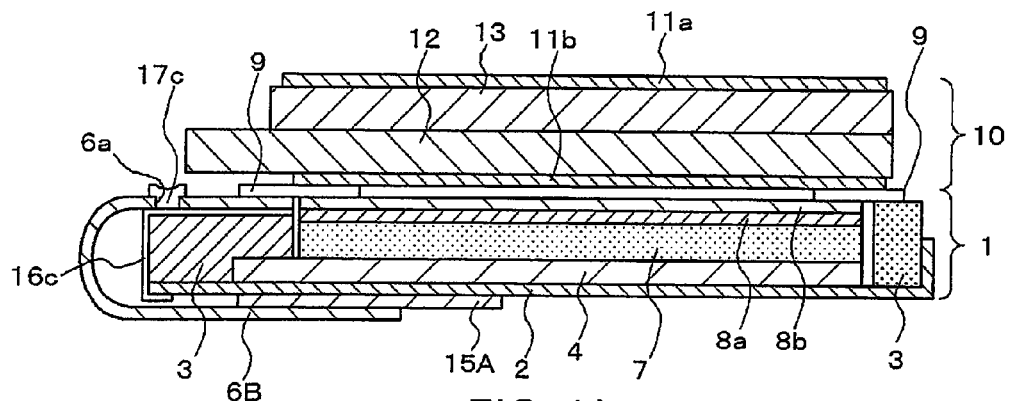
Figure 4B:
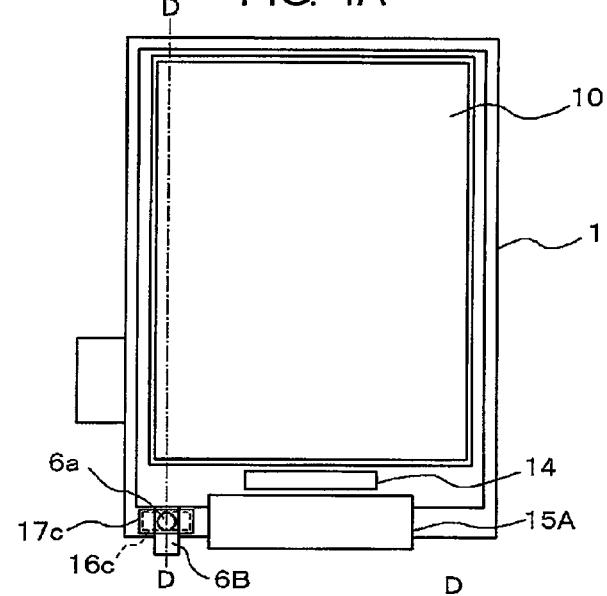
Figure 4C:
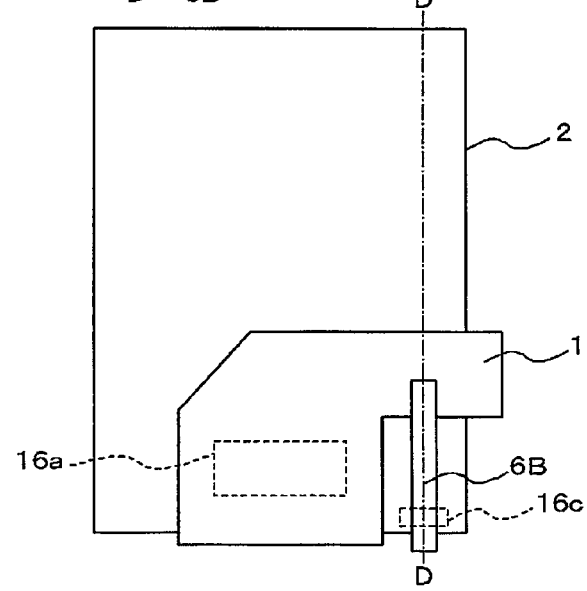

Next, a fourth exemplary embodiment of this invention is described. FIG. 4A is a cross-sectional view of a liquid crystal display device according to the fourth exemplary embodiment of this invention. Further, FIG. 4B is a plane view seen from the front surface side, and FIG. 4C is a plane view seen from the back surface side. Note that, FIG. 4A is a cross-sectional view taken along the line D-D of each of FIGS. 4B and 4C.

A summary of the liquid crystal display device according to the fourth exemplary embodiment is as follows. FIG. 4A shows an exemplary embodiment, in which the illustrated liquid crystal display device comprises a backlight FPC board 6B which has a wiring and electrodes for the LED and also has a hole 6a formed therein. The backlight FPC board 6B is adhered by a double-sided pressure sensitive adhesive tape 16c to the front surface of the frame 3, which acts as a support portion. The double-sided pressure sensitive adhesive tape 16c may be referred to as a first fixing member or first fixation member.

Further, a pressure sensitive adhesive tape 17c is adhered over an upper portion of the hole 6a formed in the backlight FPC board 6B and may be referred to as a second fixing member or a second fixation member. Through the hole 6a formed in the backlight FPC board 6B, the double-sided pressure sensitive adhesive tape 16c and the pressure sensitive adhesive tape 17c are adhered to each other. In this manner, the backlight FPC board 6B is fixed to the support portion by a double fixing structure.

Hereinafter, details are described. The liquid crystal display device includes the backlight unit 1, the liquid crystal panel 10, the backlight FPC board 6B connected to the backlight unit 1, and the liquid crystal panel FPC board 15A connected to the liquid crystal panel 10.

The hole 6a is formed in the backlight FPC board 6B at a position situated on the front surface side of the backlight unit 1, and the backlight FPC board 6B is adhered to the front surface of the frame 3 by the double-sided pressure sensitive adhesive tape 16c.

Further, the pressure sensitive adhesive tape 17c is adhered over the upper portion of the hole 6a of the backlight FPC board 6B, and thus the double-sided pressure sensitive adhesive tape 16c and the pressure sensitive adhesive tape 17c are adhered to each other through the hole 6a.

In this manner, the adhesion between the double-sided pressure sensitive adhesive tape 16c and the pressure sensitive adhesive tape 17c makes it possible to prevent a trouble that the bent backlight FPC board 6B is separated from the double-sided pressure sensitive adhesive tape 16c.

Note that, in place of the pressure sensitive adhesive tape 17c, even when the double-sided pressure sensitive adhesive tape 9 for the liquid crystal panel is extended to reach the upper portion of the hole 6a of the backlight FPC board 6B, similar effects may be obtained.

Further, as illustrated in FIG. 4A, when the double-sided pressure sensitive adhesive tape 16c is provided across the side surface of the frame 3 to reach the back surface of the backlight back surface plate 2 so that the adhesion area between the double-sided pressure sensitive adhesive tape 16c and the frame 3 is widened, it is possible to effectively prevent a trouble that the double-sided pressure sensitive adhesive tape 16c is separated from the frame 3.

<Fifth Exemplary Embodiment>

Figure 5A:
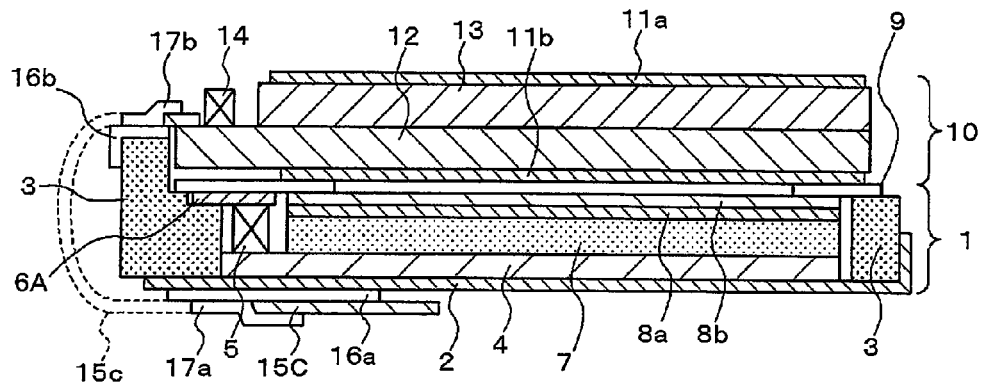
Figure 5B:
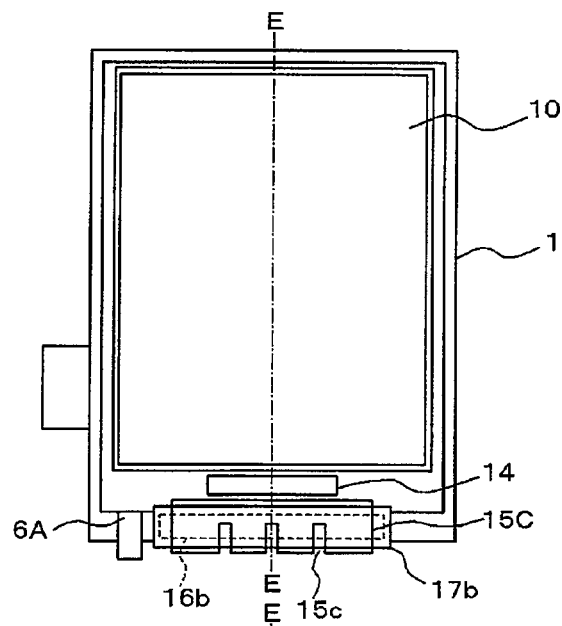
Figure 5C:
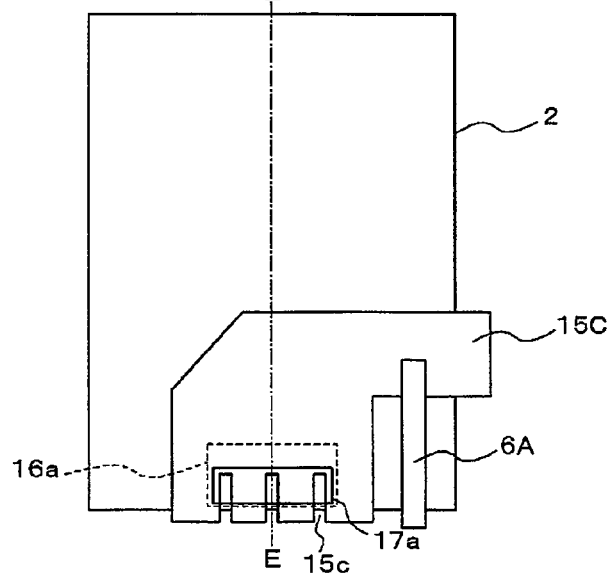
Figure 6A:
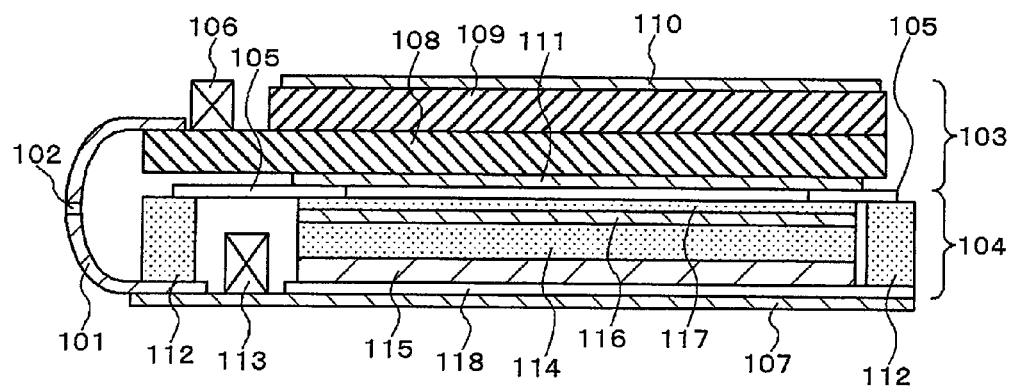
Figure 6B:
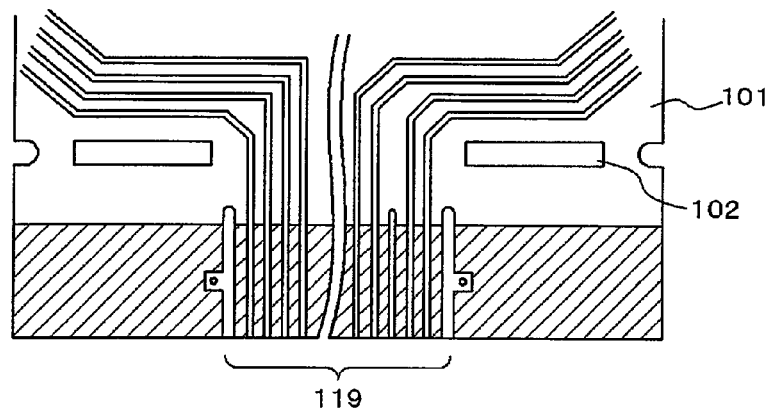
Figure 7:
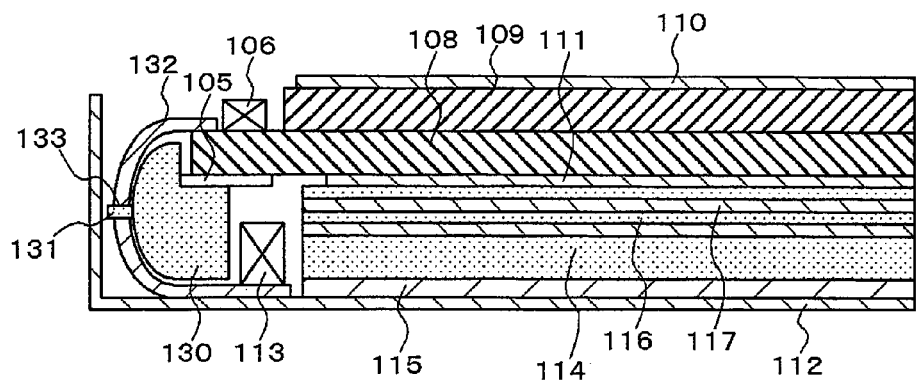
FIG. 7 is a view of another liquid crystal display device according to a related art.
Figure 8A:
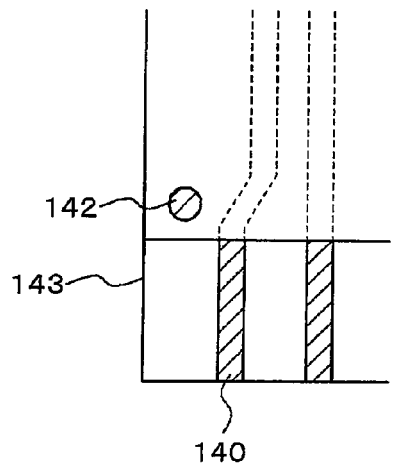
Figure 8B:
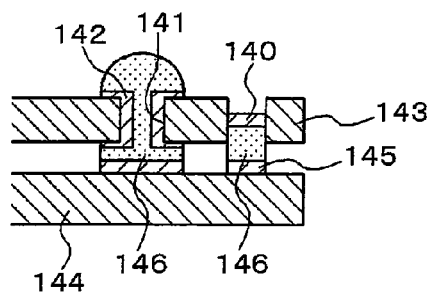
Figure 9:
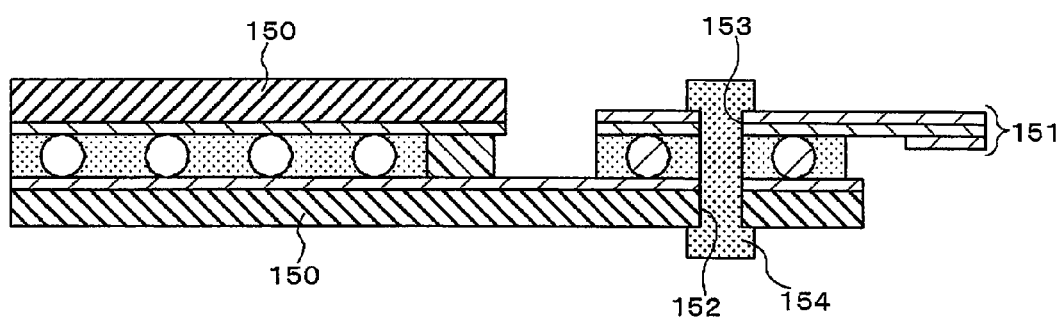
FIG. 9 is a view of still another liquid crystal display device according to a related art.
Figure 10:
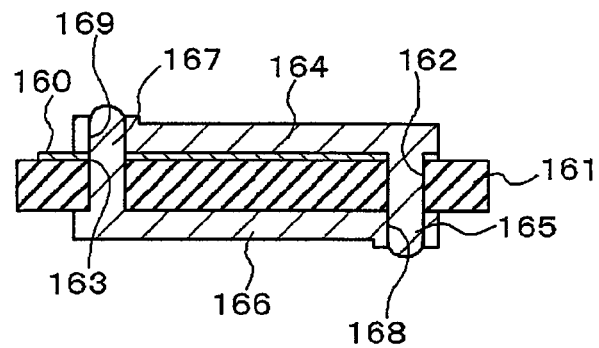
FIG. 10 is a cross-sectional view of clips for fixing a flexible printed circuit board and a fixation reinforcing structure of the flexible printed circuit board using the clips according to a related art.
Figure 11:
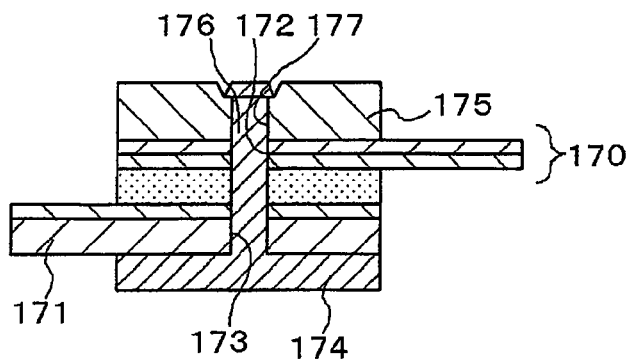
FIG. 11 is a cross-sectional view illustrating a method of jointing a printed wiring board and a flexible printed circuit board according to a related art.
Figure 12:
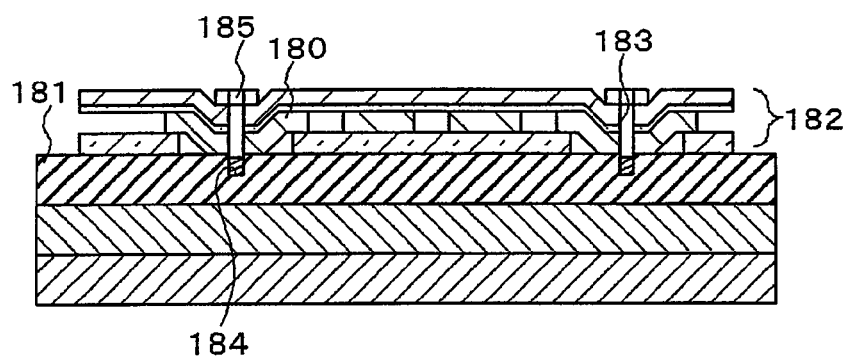
FIG. 12 is a cross-sectional view illustrating a grounded structure of a wiring of a plasma display module according to a related art.

Next, a fifth exemplary embodiment of this invention is described. FIG. 5A is a cross-sectional view of a liquid crystal display device according to the fifth exemplary embodiment of this invention. Further, FIG. 5B is a plane view seen from the front surface side, and FIG. 5C is a plane view seen from the back surface side. Note that, FIG. 5A is a cross-sectional view taken along the line E-E of each of FIGS. 5B and 5C.

The liquid crystal display device includes the backlight unit 1, the liquid crystal panel 10, the backlight FPC board 6A connected to the backlight unit 1, and an liquid crystal panel FPC board 15C connected to the liquid crystal panel 10.

Slits 15c are formed at, at least, a part of the liquid crystal panel FPC board 15C situated in a region extended from the back surface portion to the front surface portion of the backlight unit 1. Each slit 15c has an elongated shape. The liquid crystal panel FPC board 15C is adhered to the back surface side of the backlight unit 1 by the double-sided pressure sensitive adhesive tape 16a, and is adhered to the front surface side of the backlight unit 1 by the double-sided pressure sensitive adhesive tape 16b. The double-sided pressure sensitive adhesive tapes 16a and 16b may be referred to as a first fixing member or a first fixation member.

Further, the pressure sensitive adhesive tape 17a is adhered to upper portions of the slits 15c of the liquid crystal panel FPC board 15C on one side, and the pressure sensitive adhesive tape 17b is adhered to upper portions of the slits 15c of the liquid crystal panel FPC board 15C on the other side. The pressure sensitive adhesive tape 17a and 17b may be referred to as a second fixing member or a second fixation member. With this, through the slits 15c, the double-sided pressure sensitive adhesive tape 16a and the pressure sensitive adhesive tape 17a are adhered to each other, and the double-sided pressure sensitive adhesive tape 16b and the pressure sensitive adhesive tape 17b are adhered to each other. In this manner, the liquid crystal panel FPC board 15C is fixed to the support portion by a double fixing structure.

In this manner, due to the adhesion between the double-sided pressure sensitive adhesive tape 16a and the pressure sensitive adhesive tape 17a, and the adhesion between the double-sided pressure sensitive adhesive tape 16b and the pressure sensitive adhesive tape 17b, it is possible to prevent a trouble that the bent FPC board for liquid crystal panel 15C is separated from the double-sided pressure sensitive adhesive tapes 16a and 16b.

Note that, in the first and third exemplary embodiments described above, three holes 15a are formed in the liquid crystal panel FPC board and in the second exemplary embodiment described above, three holes 15b are formed in the liquid crystal panel FPC board. Further, in the fourth exemplary embodiment, one hole 6a is formed in the backlight FPC board 6B, and in the fifth exemplary embodiment, three slits 15c are formed in the liquid crystal panel FPC board 15C. However, each of the holes 15a, 15b, and 6a and slits 15c may have an arbitrary shape and the number of the holes and slits may be arbitrary determined, within the design limitation.

Further, by forming a side surface of the backlight unit in a curved shape, forming a hole or a slit in the FPC board at a portion positioned at the side surface of the backlight unit, adhering the portion of the FPC board in which the hole or the slit is formed to the side surface of the backlight unit by a double-sided pressure sensitive adhesive tape, and adhering a pressure sensitive adhesive tape over an upper portion of the hole or the slit formed in the FPC board, the double-sided pressure sensitive adhesive tape and the pressure sensitive adhesive tape may be adhered to each other through the hole or the slit formed in the FPC board.

Further, in the first to fourth exemplary embodiments, a pressure sensitive adhesive, that is, the double-sided pressure sensitive adhesive tape is used as the first fixing member, but the pressure sensitive adhesive may be replaced by a resin adhesive or a hot melt adhesive. Examples of the resin adhesive may include an acrylic resin adhesive, an epoxy resin adhesive, and a cyanoacrylate adhesive. Examples of the hot melt adhesive may include an ethylene-vinyl acetate copolymer hot melt adhesive, a polyamide hot melt adhesive, and a polyolefin hot melt adhesive.

Further, in the second to fourth exemplary embodiments, the pressure sensitive adhesive tape used as the second fixing member may be replaced by the resin adhesive or the hot melt adhesive.

Further, on an upper portion of the resin adhesive, the hot melt adhesive, or the pressure sensitive adhesive, which is the second fixing member, a sheet-shaped or film-shaped structure may be provided.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims. For example, the invention is applicable to any other flat panel display device than the liquid crystal display device. Specifically, when the invention is applied to an organic EL device, the backlight unit 1 may be removed and the panel 10 may be replaced by an organic EL panel.

What is claimed is:

1. A display device, comprising:
   a frame or backlight;
   a flexible printed circuit board, outermost edges of said flexible circuit board delimiting an outer boundary surrounding an interior of the flexible circuit board, the flexible circuit board formed into a bent state supported by the frame or backlight, the flexible circuit board having at least one of a hole and a slit located entirely within the interior of the flexible printed circuit board at a distance from the outer boundary;
   a first fixing member which fixes the flexible printed circuit board to the frame or backlight; and
   a second fixing member which is fixed to the first fixing member through the one of the hole and the slit,
   wherein the second fixing member is formed by at least one adhesive material selected from a group consisting of a resin adhesive, a hot melt adhesive, and a pressure sensitive adhesive.

2. A display device, comprising:

a frame or backlight;

a flexible printed circuit board, outermost edges of said flexible circuit board delimiting an outer boundary surrounding an interior of the flexible circuit board, the flexible circuit board formed into a bent state supported by the frame or backlight, at least one of a hole and a slit located entirely within the interior of the flexible printed circuit board at a distance from the outer boundary;

a first fixing member which fixes the flexible printed circuit board to the frame or backlight; and a second fixing member which is fixed to the first fixing member through the one of the hole and the slit, wherein the second fixing member is formed by a pressure sensitive adhesive tape.

3. A display device, comprising:

a backlight unit having a front surface portion and a back surface portion;

a liquid crystal panel placed over the front surface portion of the backlight unit;

a flexible printed circuit board, outermost edges of said flexible circuit board delimiting an outer boundary surrounding an interior of the flexible circuit board, the flexible printed circuit board connected to one of the backlight unit and the liquid crystal panel and having one of a hole and a slit formed entirely within the interior of the flexible printed circuit board at a distance from the outer boundary;

a double-sided pressure sensitive adhesive tape which is adhered to the backlight unit, with the flexible printed circuit board kept in a bent state; and a pressure sensitive adhesive tape which is adhered over an upper portion of the one of the hole and the slit formed in the flexible printed circuit board, the double-sided pressure sensitive adhesive tape and the pressure sensitive adhesive tape are adhered to each other through the one of the hole and the slit.

4. The display device according to claim 3, wherein the backlight unit includes a light source and a reflection film, the light source being mounted over the flexible printed circuit board, and the reflection film is placed over the flexible printed circuit board and has a portion extended under the light source.

\* \* \* \* \*